(12) United States Patent
Fan

(10) Patent No.: US 6,221,745 B1
(45) Date of Patent: Apr. 24, 2001

(54) HIGH SELECTIVITY MASK OXIDE ETCHING TO SUPPRESS SILICON PITS

(75) Inventor: Yuh-Da Fan, Miao-Li (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/200,590

(22) Filed: Nov. 27, 1998

(51) Int. Cl.$^7$ .................... H01L 21/302; H01L 21/3205

(52) U.S. Cl. .................. 438/592; 438/720; 438/738; 438/952

(58) Field of Search .................... 438/585, 591, 438/592, 738, 711, 712, FOR 120, FOR 127, 720, 952

(56) References Cited

U.S. PATENT DOCUMENTS

| | | | |
|---|---|---|---|
| 5,468,340 | * 11/1995 | Gupta et al. | 438/738 |
| 5,710,076 | 1/1998 | Dai et al. | 438/305 |
| 5,773,199 | * 6/1998 | Linliu et al. | 438/316 |
| 5,869,403 | * 2/1999 | Becker et al. | 438/738 |
| 5,924,000 | * 7/1999 | Linliu | 438/592 |
| 5,924,001 | * 7/1999 | Yang et al. | 438/592 |
| 5,935,877 | * 8/1999 | Autryve | 438/743 |

OTHER PUBLICATIONS

C.Y. Chang et al."VLSI Technology" McGraw–Hill Company, NY, NY, 1997, p 353–354.

* cited by examiner

*Primary Examiner*—M. Wilczewski
(74) *Attorney, Agent, or Firm*—George O. Saile; Stephen B. Ackerman; Rosemary L.S. Pike

(57) ABSTRACT

A method for fabricating polycide gate electrodes wherein silicon pits in the active region are avoided by using a two-step etch to prevent pinholes in a BARC layer from penetrating significantly the silicide layer is described. A layer of gate silicon oxide is grown over the surface of a semiconductor substrate. A polysilicon layer is deposited overlying the gate silicon oxide layer. A silicide layer is formed overlying the polysilicon layer. A hard mask layer is deposited overlying the silicide layer. An anti-reflective coating layer is formed overlying the hard mask layer. A photoresist mask is formed over the anti-reflective coating layer wherein a pinhole is formed in the surface of the anti-reflective coating layer not covered by the photoresist mask. First the anti-reflective coating layer is etched through using $O_2$ and $N_2$ gases where it is not covered by the photoresist mask to the hard mask layer. Secondly, the hard mask layer is etched through using $CHF_3$, $CF_4$, Ar, and $N_2$ gases where it is not covered by the photoresist mask to the silicide layer wherein the pinhole in the anti-reflective coating layer does not significantly penetrate the silicide layer. The silicide, polysilicon and gate silicon oxide layers are patterned where they are not covered by the hard mask wherein since the pinhole does not significantly penetrate the silicide layer, formation of silicon pits in the semiconductor substrate is prevented.

16 Claims, 3 Drawing Sheets

HIGH SELECTIVITY MASK OXIDE ETCHING TO SUPPRESS SILICON PITS

BACKGROUND OF THE INVENTION (1) Field of the Invention

The invention relates to the fabrication of integrated circuit devices, and more particularly, to a method of preventing silicon pits in the active region in the fabrication of integrated circuits.

(2) Description of the Prior Art

As device sizes shrink into the sub-micron and sub-half-micron regime, it has become necessary to use a combination of polysilicon and refractory metal suicides as the material for gate electrodes and interconnection lines because of their reduced resistivity. It is also essential to keep the active regions as free from defects as possible. Pitting of the silicon in the active areas can cause junction leakage and low yields. FIG. 1 illustrates a partially completed integrated circuit device in which formed on a semiconductor substrate 10. A gate oxide 14 is grown on the substrate and overlaid with a polysilicon layer 16. Silicide layer 18 is deposited over the polysilicon layer and a tetraethoxysilane (TEOS) oxide layer 20 overlies the silicide layer as a hard mask. A barrier and antireflective coating (BARC) layer 22 is coated over the TEOS oxide layer 20 to underlay the photoresist mask 24.

Pinhole 25 forms in the BARC layer due to spin speed. As the BARC and hard mask layers 22 and 20 are etched to form the hard mask, as shown by dotted lines in FIG. 1, the portion of the layers underlying the pinhole 25 etches faster than the other portions of the layers resulting in a pit 27 in the silicide layer 18, as shown in FIG. 2. This pit may penetrate about 300 Angstroms into the silicide layer. When the polysilicon and silicide layers 16 and 18 are patterned to form a gate electrode, as illustrated by the dotted lines in FIG. 2, a pit is formed in the silicon underlying the silicide pit 27. Pitting of the silicon in the active areas can cause junction leakage and low yields.

Co-pending U.S. patent applications Ser. Nos. 09/004,188 to C. M. Yang et al and 09/004,190 to C. M. Yang et al, both filed on Jan. 8, 1998, teach different methods of preventing silicon pits in the active region by eliminating voids at the silicide/polysilicon interface. U.S. Pat. No. 5,710,076 to Dai et al teaches a two-step etching process in which the BARC and photoresist layers are etched using $O_2/CHF_3/Ar$, followed by an oxide etch using $CHF_3/CF_4/Ar$ with a selectivity of oxide to BARC of 10:3. The use of $CHF_3$ and $CF_4$ as oxide etchants is disclosed in the book, *ULSI Technology* by C. Y. Chang and S. M. Sze, McGraw-Hill Company, NY, N.Y., C. 1997, pp. 353–354.

SUMMARY OF THE INVENTION

A principal object of the present invention is to provide an effective and very manufacturable method of fabricating polycide gate electrodes in the fabrication of integrated circuit devices.

A further object of the invention is to provide a method of fabricating polycide gates wherein silicon pits in the active region are avoided.

Yet another object of the invention is to provide a method of fabricating polycide gate electrodes wherein pinholes in a BARC layer do not significantly penetrate the silicide layer.

Yet another object is to provide a method of fabricating polycide gate electrodes wherein silicon pits in the active region are avoided by preventing pinholes in a BARC layer from penetrating significantly the silicide layer.

A still further object of the invention is to provide a method of fabricating polycide gate electrodes wherein silicon pits in the active region are avoided by using a two-step etch to prevent pinholes in a BARC layer from penetrating significantly the silicide layer.

Yet another object of the invention is to provide a method of fabricating polycide gate electrodes wherein silicon pits in the active region are avoided by using a two-step etch in which a BARC layer is first etched and then the hard mask layer is etched secondly to prevent pinholes in the BARC layer from penetrating significantly the silicide layer.

In accordance with the objects of this invention a method for fabricating polycide gate electrodes wherein silicon pits in the active region are avoided by using a two-step etch to prevent pinholes in a BARC layer from penetrating significantly the silicide layer is achieved. A layer of gate silicon oxide is grown over the surface of a semiconductor substrate. A polysilicon layer is deposited overlying the gate silicon oxide layer. A silicide layer is formed overlying the polysilicon layer. A hard mask layer is deposited overlying the silicide layer. An anti-reflective coating layer is formed overlying the hard mask layer. A photoresist mask is formed over the anti-reflective coating layer wherein a pinhole is formed in the surface of the anti-reflective coating layer not covered by the photoresist mask. First the anti-reflective coating layer is etched through using $O_2$ and $N_2$ gases where it is not covered by the photoresist mask to the hard mask layer. Secondly, the hard mask layer is etched through using $CHF_3$, $CF_4$, Ar, and $N_2$ gases where it is not covered by the photoresist mask to the silicide layer wherein the pinhole in the anti-reflective coating layer does not significantly penetrate the silicide layer. The silicide, polysilicon and gate silicon oxide layers are patterned where they are not covered by the hard mask wherein since the pinhole does not significantly penetrate the silicide layer, formation of silicon pits in the semiconductor substrate is prevented.

BRIEF DESCRIPTION OF THE DRAWINGS

In the accompanying drawings forming a material part of this description, there is shown.

DESCRIPTION OF THE PREFERRED EMBODIMENTS

FIGS. 1–7 illustrate an N-channel MOSFET integrated circuit device. However, it is well understood by those skilled in the art that a P channel FET integrated circuit device could be formed by simply substituting opposite polarities to those given for the N channel embodiment. Also, in a similar way, a CMOSFET could be formed by making both N channel and P channel devices upon the same substrate.

Figure 3:
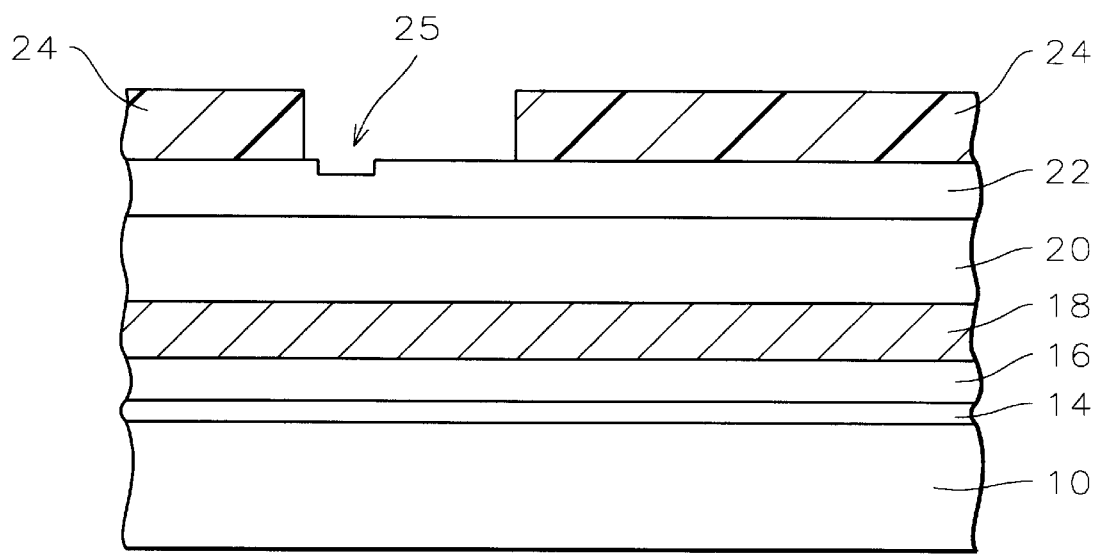
FIGS. 3 through 7 schematically illustrate in cross-sectional representation a preferred embodiment of the present invention.

Referring now more particularly to FIG. 3, there is shown an illustration of a partially completed metal oxide field effect transistor (MOSFET) integrated circuit device. The semiconductor substrate 10 is preferably composed of silicon having a (100) crystallographic orientation. In an effort to simplify the description and the drawings, the dielectric isolation between devices has been only partially shown and will not be described in detail, because they are conventional. Then semiconductor devices can be provided according to the following processes.

The surface of the silicon substrate 10 is thermally oxidized to form the desired gate oxide layer 14. The preferred thickness is between about 65 to 75 Angstroms.

Polysilicon layer 16 is deposited by low pressure chemical vapor deposition (LPCVD) to a thickness of between about 1900 and 2100 Angstroms. Then a layer of tungsten silicide 18 is deposited by chemical vapor deposition to a thickness of between about 1200 and 1300 Angstroms. Alternatively, another silicide such as cobalt silicide could be used.

A hard mask, such as TEOS oxide 20, is deposited over the silicide layer to prevent shorts to the polysilicon gate during contact formation. This hard mask layer is typically deposited to a thickness of between about 1900 and 2100 Angstroms. Alternatively, the hard mask layer may comprise silicon nitride.

Now a barrier and anti-reflective coating (BARC) layer 22 is deposited over the hard mask layer to a thickness of between about 1400 and 1600 Angstroms. Finally, a photoresist mask 24 is formed over the BARC layer, as shown in FIG. 3. Inevitably, pinhole 25 is formed in the BARC layer 22 because of spin speed.

Figure 1:
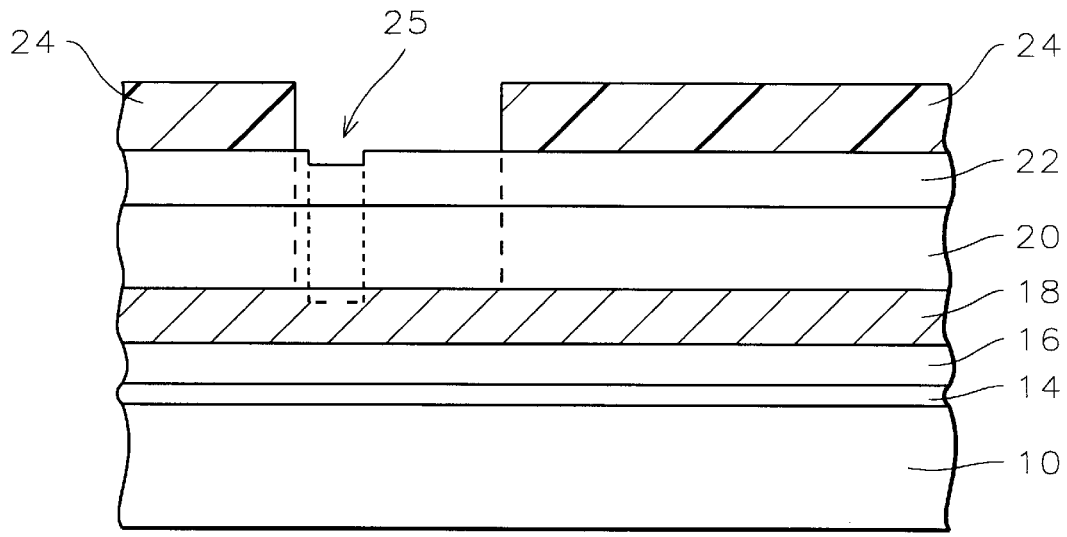
FIGS. 1 and 2 schematically illustrate in cross-sectional representation the silicon pitting problem of the prior art.
Figure 2:
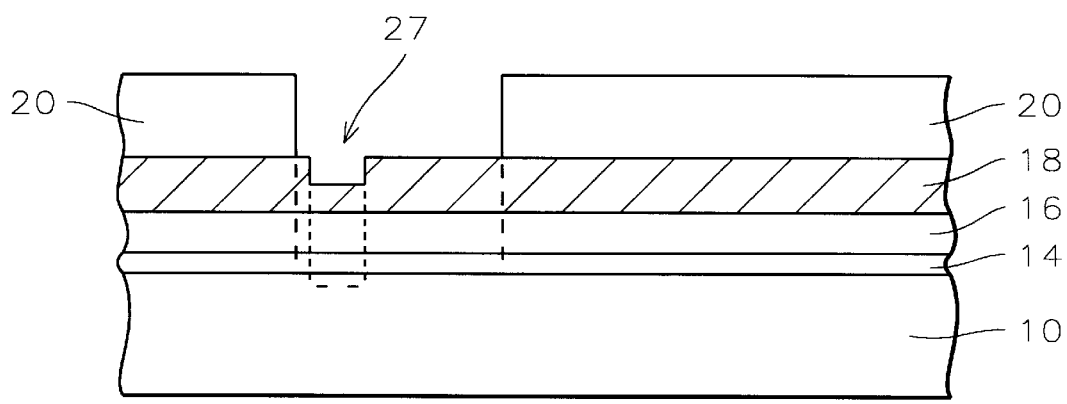

In forming the silicide gate electrodes or interconnection lines, the TEOS oxide layer is first etched to form a hard mask. The photoresist mask is removed and the hard mask is used in etching the silicide and polysilicon layers. As shown in FIGS. 1 and 2 of the prior art, the pinhole in the BARC layer penetrates the silicide layer and propagates into the silicon layer causing the undesirable silicon pitting. The pits may cause junction leakage and low yields. Scanning Electron Microscope (SEM) profiles have shown the presence of these pits in the prior art. The process of the present invention prevents the formation of silicon pits by preventing the pinhole in the BARC layer from penetrating significantly the silicide layer.

The process of the present invention prevents the pinhole from penetrating significantly the silicide layer during the formation of the hard mask by implementing a two-step etching process.

Figure 4:
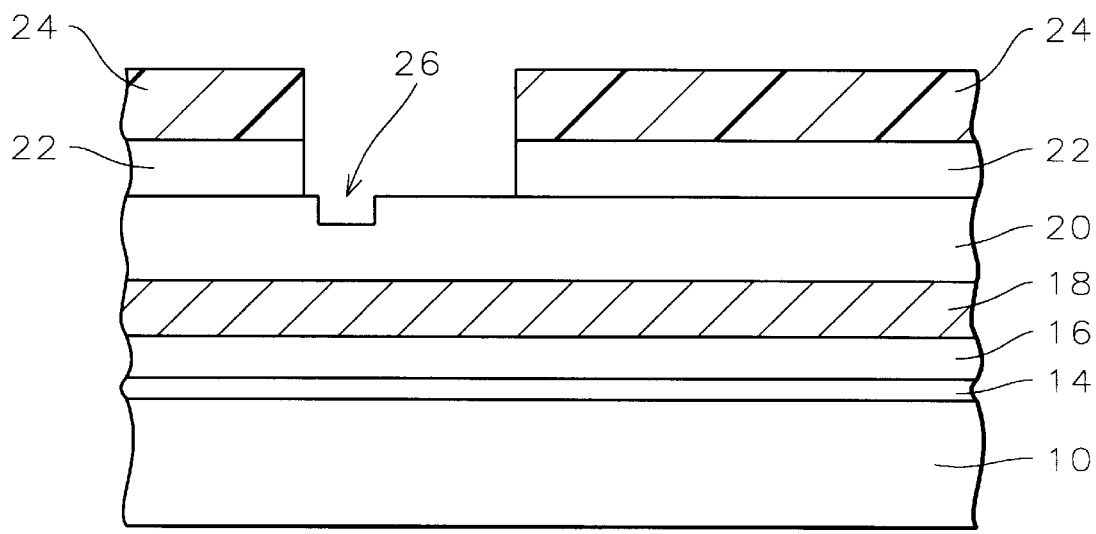

Referring now to FIG. 4, the first step of the hard mask etching process utilizes $O_2$ and $N_2$ gases to etch through the BARC layer. The area of the hard mask layer 20 under the pinhole is etched into as shown by pit 26 in the figure.

Figure 5:
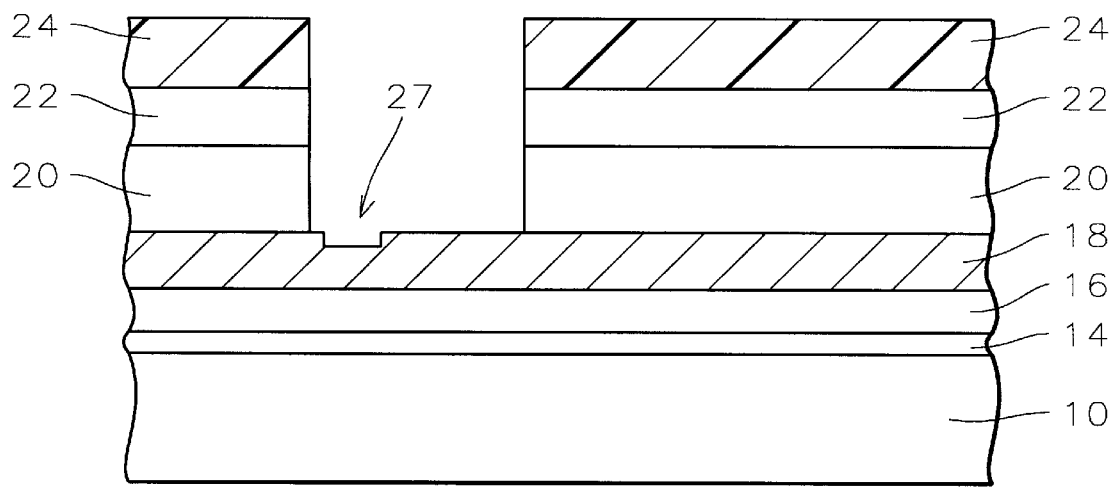

The second step of the hard mask etching process utilizes $CHF_3$, $CF_4$, Ar, and $N_2$ gases to etch through the oxide hard mask layer 20 with an etch stop at the silicide layer, as shown in FIG. 5. The pit 27 penetrates the silicide layer by less than about 100 Angstroms. This is not a significant amount and will not cause the silicon pitting of the prior art. The presence of the $N_2$ gas improves the profile striation.

Figure 6:
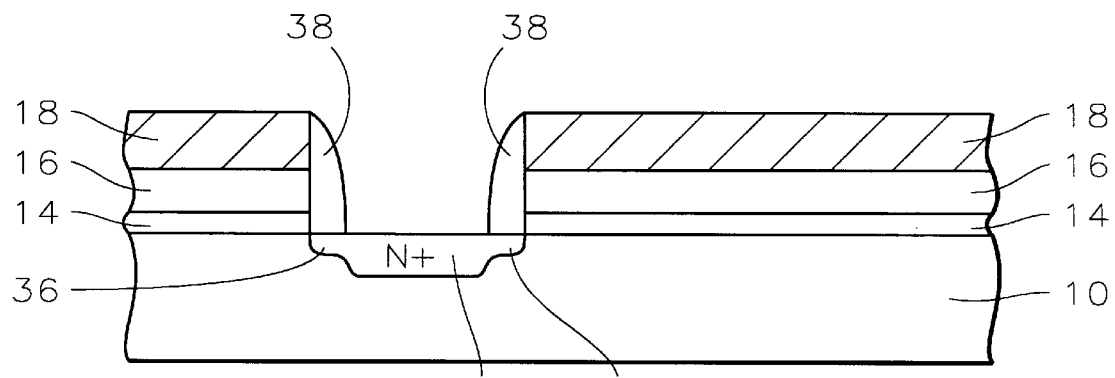

After the hard mask has been formed and the photoresist removed, the hard mask is used to etch away the silicide, polysilicon, and gate oxide layers 18, 16, and 14, respectively, to form the desired gate electrodes and interconnection lines as illustrated in FIG. 6.

Processing continues as is conventional in the art to complete the integrated circuit device. For example, as illustrated in FIG. 6, the source/drain structure of the MOSFET is formed as is conventional. The lightly doped drain (LDD) N-regions 36 are ion implanted. A layer of silicon oxide, such as TEOS oxide, is blanket deposited over the wafer's exposed surfaces and etched to form spacers 38 on the sidewalls of the gate electrode. The LDD source/drain regions are completed by the ion implantation of N+ions, such as phosphorus or arsenic to form the heavily doped regions 40.

Figure 7:
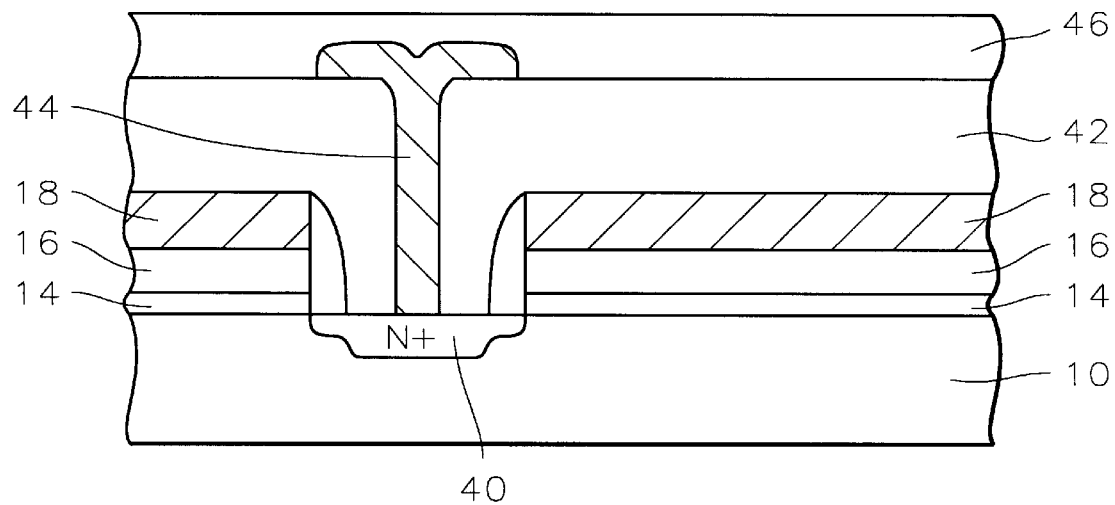

The integrated circuit device is completed by forming electrical connections between devices. For example, as illustrated in FIG. 7, insulating layer 42 is deposited over the surface of the substrate. Contact openings are made through the insulating layer to the underlying semiconductor devices, such as to a source/drain region 40. A metal layer 44 is deposited and patterned to form electrical connections between the elements of the integrated circuit. A passivation layer 46 completes the fabrication of the integrated circuit device.

The process of the invention provides a simple and effective method of preventing silicon pits in the active areas. The two-step etching process used to form the hard mask prevents the significant penetration of the silicide layer by pinholes formed in the BARC layer. This in turn prevents the formation of silicon pits during gate etching.

While the invention has been particularly shown and described with reference to the preferred embodiments thereof, it will be understood by those skilled in the art that various changes in form and details may be made without departing from the spirit and scope of the invention.

What is claimed is:

1. A method of fabricating gate electrodes in the manufacture of an integrated circuit device comprising:

growing a layer of gate silicon oxide over the surface of a semiconductor substrate;

depositing a polysilicon layer overlying said gate silicon oxide layer;

forming a silicide layer overlying said polysilicon layer;

depositing a hard mask layer overlying said silicide layer;

forming an anti-reflective coating layer overlying said hard mask layer;

forming a photoresist mask over said anti-reflective coating layer;

first etching through said anti-reflective coating layer where it is not covered by said photoresist mask to said hard mask layer wherein said first etching consists of etching with an etching gas consisting of $O_2$ and $N_2$ gases;

second etching through said hard mask layer where it is not covered by said photoresist mask to said silicide layer wherein said second etching comprises etching with $CHF_3$, $CF_4$, Ar, and $N_2$ gases; and patterning said silicide, said polysilicon and said gate silicon oxide layers where they are not covered by said hard mask to complete fabrication of said gate electrodes in the manufacture of said integrated circuit device.

2. The method according to claim 1 wherein said polysilicon layer is deposited by low pressure chemical vapor deposition to a thickness of between about 1400 and 1600 Angstroms.

3. The method according to claim 1 wherein said silicide layer has a thickness of between about 1200 and 1400 Angstroms.

4. The method according to claim 1 wherein said silicide layer comprises tungsten silicide.

5. The method according to claim 1 wherein said silicide layer comprises cobalt silicide.

6. The method according to claim 1 wherein said hard mask layer comprises tetraethoxysilane (TEOS) oxide having a thickness of between about 1900 and 2100 Angstroms.

7. The method according to claim 1 wherein said anti-reflective coating layer has a thickness of between about 1400 and 1600 Angstroms.

8. The method according to claim 1 wherein said steps of first etching and second etching prevent pinholes formed in said anti-reflective coating layer from penetrating significantly said silicide layer and thereby prevents the formation of pits in said semiconductor substrate during said patterning of said silicide and polysilicon layers.

9. A method of fabricating a gate electrode in the manufacture of an integrated circuit device wherein the formation of silicon pits in a semiconductor substrate adjacent to said gate electrode is prevented comprising:

growing a layer of gate silicon oxide over the surface of said semiconductor substrate;

depositing a polysilicon layer overlying said gate silicon oxide layer;

forming a silicide layer overlying said polysilicon layer;

depositing a hard mask layer overlying said silicide layer;

forming an anti-reflective coating layer overlying said hard mask layer wherein a pinhole is formed in the surface of said anti-reflective coating layer;

forming a photoresist mask over said anti-reflective coating layer wherein said pinhole is not covered by said photoresist mask;

first etching through said anti-reflective coating layer where it is not covered by said photoresist mask to said hard mask layer wherein said first etching consists of etching with an etching gas consisting of $O_2$ and $N_2$ gases;

second etching through said hard mask layer where it is not covered by said photoresist mask to said silicide layer wherein said second etching comprises etching with $CHF_3$, $CF_4$, Ar, and $N_2$ gases wherein said pinhole in said anti-reflective coating layer does not significantly penetrate said silicide layer; and patterning said silicide, said polysilicon and said gate silicon oxide layers where they are not covered by said hard mask wherein since said pinhole does not significantly penetrate said silicide layer, said formation of said silicon pits in said semiconductor substrate is prevented to complete fabrication of said gate electrodes in the manufacture of said integrated circuit device.

10. The method according to claim 9 wherein said polysilicon layer is deposited by low pressure chemical vapor deposition to a thickness of between about 1400 and 1600 Angstroms.

11. The method according to claim 9 wherein said silicide layer has a thickness of between about 1200 and 1400 Angstroms.

12. The method according to claim 9 wherein said silicide layer comprises tungsten silicide.

13. The method according to claim 9 wherein said hard mask layer comprises tetraethoxysilane (TEOS) oxide having a thickness of between about 1900 and 2100 Angstroms.

14. The method according to claim 9 wherein said anti-reflective coating layer has a thickness of between about 1400 and 1600 Angstroms.

15. A method of fabricating a gate electrode in the manufacture of an integrated circuit device wherein the formation of silicon pits in a semiconductor substrate adjacent to said gate electrode is prevented comprising:

growing a layer of gate silicon oxide over the surface of said semiconductor substrate;

depositing a polysilicon layer overlying said gate silicon oxide layer;

forming a silicide layer overlying said polysilicon layer;

depositing a tetraethoxysilane (TEOS) oxide hard mask layer overlying said silicide layer;

forming an anti-reflective coating layer overlying said hard mask layer wherein a pinhole is formed in the surface of said anti-reflective coating layer;

forming a photoresist mask over said anti-reflective coating layer wherein said pinhole is not covered by said photoresist mask;

first etching through said anti-reflective coating layer it is not covered by said photoresist mask to said hard mask layer wherein said first etching wherein said first etching consists of etching with an etching gas consisting of $O_2$ and $N_2$ gases;

second etching through said hard mask layer where it is not covered by said photoresist mask to said silicide layer wherein said second etching comprises etching with $CHF_3$, $CF_4$, Ar, and $N_2$ gases wherein said pinhole in said anti-reflective coating layer does not significantly penetrate said sulicide layer; and patterning said silicide, said polysilicon and said gate silicon oxide layers where they are not covered by said hard mask wherein since said pinhole does not significantly penetrate said silicide layer, said formation of said silicon pits in said semiconductor substrate is prevented to complete fabrication of said gate electrodes in the manufacture of said integrated circuit device.

16. The method according to claim 15 wherein said silicide layer comprises tungsten silicide.

* * * * *